Dec. 1, 1964
K. KADELBURG
3,159,462
SEMICONDUCTOR AND SECURED METAL BASE
AND METHOD OF MAKING THE SAME
Filed Sept. 24, 1962
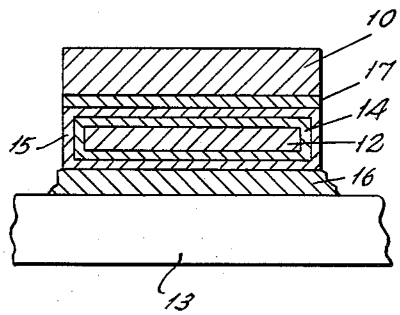
INVENTOR.
KURT KADELBURG
BY
OSTROLENK, FABER, GERB & SOFFEN
ATTORNEYS

United States Patent Office 3,159,462

Patented Dec. 1, 1964

3,159,462

SEMICONDUCTOR AND SECURED METAL BASE AND METHOD OF MAKING THE SAME

Kurt Kadelburg, Los Angeles, Calif., assignor to International Rectifier Corporation, El Segundo, Calif., a corporation of California Filed Sept. 24, 1962, Ser. No. 225,763
4 Claims. (Cl. 29—195)

My invention relates to a novel means for securing a contact to a semiconductor element, and more specifically relates to a novel method for securing a tungsten contact to a silicon wafer by a gold boron solder which is found to appropriately wet the tungsten.

In the manufacture of semiconductor elements, it is necessary that the semiconductor wafer which could, for example, be silicon having various types of junctions therein, be secured to contact structures such as molybdenum or tungsten contact structures. Molybdenum and tungsten have been found particularly satisfactory as contact elements, since their thermal coefficient of expansion closely approaches the coefficient of expansion of silicon.

When tungsten is specifically used as the contact material, it has been the practice to gold-plate the tungsten before securing it to the wafer. This method has been generally unsatisfactory, since the adherence between the gold-plating and the tungsten is poor.

In attempts to avoid these problems, gold antimony and gold tin alloys have been used as plating media for the tungsten, but with little success.

I have found that a gold boron medium will serve as a satisfactory solder for the tungsten in that the boron apparently combines with the oxide of the tungsten and thus results in an improved wetting of the tungsten.

The novel gold boron-coated tungsten contacts can then be soldered to the silicon wafer on one side and to a copper heat sink on the other where the wafer is secured to the copper heat sink by a gold germanium solder which will withstand extreme thermal fatigue.

Accordingly, a primary object of this invention is to provide an improved alloy contact.

Another object of this invention is to provide a novel method for wetting tungsten contacts.

A further object of this invention is to provide a novel method of manufacture of a semiconductor device having a tungsten contact.

These and other objects of my novel invention will become apparent from the following description when taken in connection with the drawing which illustrates an embodiment of the invention.

Referring now to the drawing which illustrates one portion of a semiconductor device, there is provided a silicon wafer 10 which contains various appropriate junctions therein. In order to permit the silicon device to have relatively high current ratings such as 50 amperes, a tungsten contact 12 is provided to secure the silicon wafer 10 to a copper base or heat sink 13.

In accordance with the present invention, the tungsten wafer 12 was first provided with nickel-plated coating 14 which is formed by appropriate electroforming techniques. The coating 14, for example, has a thickness of .0001 inch which thereafter is sintered in at about 1000° C.

The nickel plating may be applied by any well known method using a solution, for example, composed of 30 to 50 oz. of nickel sulfate heptahydrate $NiSO_4.7H_2O$, 4 to 8 oz. of nickel chloride hexahydrate $NiCl_2.6H_2O$ and 4 to 6 oz. of boric acid $H_3BO_3$ per gallon of solution. The solution to be maintained at a pH of 2 to 5 and a temperature of 120–160° F. Plating to be applied at a current density of 20–60 amps./square feet.

A gold boron alloy having of the order of .05% or more boron was then alloyed in vacuum to wafer 12 to form a coating 15 about wafer 12 having a thickness of the order of 0.0015 inch. This alloying operation was carried out in a vacuum by usual vacuum alloying techniques, and at elevated temperatures which just reach temperatures of the order of 1065–1100° C. which is the melting temperature of alloy 15. When this melting temperature was reached during the alloying operation, the wetting of the tungsten wafer 12, which was previously nickel-plated, was found to be excellent, so that considerable adherence was developed between alloying coating 15 and the tungsten body 12. Thereafter, the silicon wafer 10 was secured to the upper surface of layer 15 by an appropriate solder which is compatible with both the silicon and the gold boron solder and, for example can be a gold germanium Au-Ge solder 17, and the lower surface of the gold boron-plated tungsten was secured to copper heat sink 13 with a similar gold germanium solder layer 16 where the soldering operation was carreid out at a temperature of 350°–375° C.

Although I have described preferred embodiments of my novel invention, many variations and modifications will now be obvious to those skilled in the art, and I prefer, therefore, to be limited not by the specific disclosure herein but only by the appended claims.

I claim:

1. A semiconductor element which comprises:
(*a*) a silicon semiconductor wafer;
(*b*) a copper base for said wafer;
(*c*) a tungsten wafer for securing the silicon wafer to the copper base, said tungsten wafer being nickel-plated and bearing a coating constituted of a gold-boron alloy thereover; and
(*d*) a gold-germanium alloy solder bonding the silicon wafer to the gold-boron alloy coating on one side of the tungsten wafer, and bonding the gold-boron alloy coating on the opposite side of the tungsten wafer to the copper base.

2. The semiconductor element as defined in claim 1, in which the gold-boron alloy contains boron in an amount of the order of 0.05% by weight of the alloy.

3. A method of preparing a semiconductor element which comprises, in sequence, the steps of:
(*a*) nickel plating a tungsten support wafer;
(*b*) vacuum alloying a gold-boron coating atop the nickel-plated tungsten wafer by heating the wafer in the presence of the alloy composition in a vacuum at temperatures of the order of 1065° to 1100° C.;
(*c*) placing the gold-boron coated tungsten wafer intermediate a silicon semiconductor wafer and a copper base therefor; and
(*d*) soldering the gold-boron coated tungsten wafer to the silicon wafer and the copper base, respectively, with a gold-germanium solder at a temperature of from 350° to 375° C.

4. The method as defined in claim 3, in which the tungsten wafer is nickel plated by immersing the wafer in a nickel salt-containing solution maintained at a pH of from 2 to 5 and a temperature of from 120° to 160° C. and plating the wafer at a current density of from 20 to 60 amperes per square foot.

References Cited in the file of this patent

UNITED STATES PATENTS

| | | |
|---|---|---|
| 2,402,839 | Ohl | June 25, 1946 |
| 2,816,066 | Russell | Dec. 10, 1957 |
| 2,964,830 | Henkels | Dec. 20, 1960 |
| 3,025,439 | Anderson | Mar. 13, 1962 |
| 3,050,667 | Emeis | Aug. 21, 1962 |
| 3,062,691 | Goorisen | Nov. 6, 1962 |
| 3,068,127 | Patalong et al. | Dec. 11, 1962 |